United States Patent
Tang et al.

(10) Patent No.: US 11,005,079 B2
(45) Date of Patent: May 11, 2021

(54) ANTI-REFLECTION BOTTOM-EMITTING TYPE OLED DISPLAY DEVICE AND MANUFACTURING METHOD THEREOF

(71) Applicant: Wuhan China Star Optoelectronics Technology Co., Ltd., Wuhan (CN)

(72) Inventors: Yuejun Tang, Wuhan (CN); Xueyun Li, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 44 days.

(21) Appl. No.: 16/332,361

(22) PCT Filed: Feb. 15, 2019

(86) PCT No.: PCT/CN2019/075215
§ 371 (c)(1),
(2) Date: Mar. 12, 2019

(87) PCT Pub. No.: WO2020/107718
PCT Pub. Date: Jun. 4, 2020

(65) Prior Publication Data
US 2020/0176718 A1    Jun. 4, 2020

(30) Foreign Application Priority Data
Nov. 30, 2018 (CN) .......................... 201811459470.9

(51) Int. Cl.
*H01L 51/52* (2006.01)
*H01L 51/56* (2006.01)

(52) U.S. Cl.
CPC ...... *H01L 51/5284* (2013.01); *H01L 51/5253* (2013.01); *H01L 51/56* (2013.01)

(58) Field of Classification Search
CPC .. H01L 51/5253; H01L 51/5284; H01L 51/56
(Continued)

(56) References Cited

U.S. PATENT DOCUMENTS 7,692,378 B2 *  4/2010  Yamazaki ........... H01L 51/5284
                                                 313/506
2008/0017862 A1 *  1/2008  Lee ...................... H01L 27/124
                                                 257/59
(Continued)

*Primary Examiner* — Long K Tran

(57) ABSTRACT

An anti-reflection bottom-emitting type OLED display device and a manufacturing method are provided. The anti-reflection bottom-emitting type OLED display device includes a substrate, multiple drive transistors, and a light emitting layer. The substrate is provided with a plurality of black matrixes spaced apart from each other. The drive transistors are arranged in an array on the substrate and arranged corresponding to the black matrixes respectively. The light emitting layer is disposed on the drive transistors. An opening region is arranged between each two adjacent black matrixes. The light emitting layer includes multiple light-emitting material layers arranged in an array. Each light-emitting material layer defines a display region and a non-display region. Each opening region is arranged corresponding to each display region, and each non-display region is arranged corresponding to each black matrix. Each display region coincides with each opening region between the black matrixes on the substrate.

7 Claims, 4 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2009/0162982 A1* | 6/2009 | Lee ................... | G02F 1/136286 |
| | | | 438/158 |
| 2016/0035754 A1* | 2/2016 | Kim ................... | H01L 21/02502 |
| | | | 257/40 |
| 2016/0093641 A1* | 3/2016 | Takahashi ............ | G09G 3/3233 |
| | | | 257/43 |
| 2016/0172633 A1* | 6/2016 | Ahn ...................... | H01L 51/524 |
| | | | 257/40 |

* cited by examiner

ANTI-REFLECTION BOTTOM-EMITTING TYPE OLED DISPLAY DEVICE AND MANUFACTURING METHOD THEREOF

RELATED APPLICATIONS

This application is a National Phase of PCT Patent Application No. PCT/CN2019/075215 having International filing date of Feb. 15, 2019, which claims the benefit of priority of Chinese Patent Application No. 201811459470.9 filed on Nov. 30, 2018. The contents of the above applications are all incorporated by reference as if fully set forth herein in their entirety.

FIELD AND BACKGROUND OF THE INVENTION

The present invention relates to a field of display devices and in particular, to an anti-reflection bottom-emitting type OLED display device and a manufacturing method thereof.

An organic light-emitting diode (OLED) display device has been widely used in various fields as a display device for displaying an image. Unlike liquid crystal display (LCD) devices, the OLED display devices have self-illuminating properties and do not use a separate light source, so they are thinner and lighter than display devices using separate light sources, thus facilitating flexible and foldable display features. Depending on light emission directions, the OLED display devices can be classified into two types, a bottom-emitting type (i.e. illuminating downward with respect to a substrate) and a top-emitting type (i.e. illuminating upward with respect to the substrate).

The OLED display device has a multi-layer metal layer structure such as a metal wire and a circuit layer under a pixel defining layer and a bezel, which has strong reflection characteristics and easily reflects ambient light to a human eye. Hence, it is difficult to see images clearly. In solution, some OLED display devices are provided with an anti-reflection layer structure on a surface of the display. The anti-reflection layer structure is, for example, a circular polarizer (CPL) to absorb the ambient light reflected from the metal layer structure. However, the CPL greatly reduces the light output efficiency, resulting in a decrease in light utilization efficiency of the OLED display device.

SUMMARY OF THE INVENTION

An OLED display device has a multi-layer metal layer structure such as a metal wire and a circuit layer under a pixel defining layer and a bezel, which has strong reflection characteristics and easily reflects ambient light to a human eye. Hence, it is difficult to see images clearly. In solution, some OLED display devices are provided with an anti-reflection layer structure on a surface of the display. The anti-reflection layer structure is, for example, a circular polarizer (CPL) to absorb the ambient light reflected from the metal layer structure. However, the CPL greatly reduces the light output efficiency, resulting in a decrease in light utilization efficiency of the OLED display device.

Accordingly, it is necessary to provide an anti-reflection bottom-emitting type OLED display device and a manufacturing method thereof to solve the problems of the conventional techniques.

It is an objective of the present invention to provide an anti-reflection bottom-emitting type OLED display device and a manufacturing method thereof to reduce or avoid the ambient light reflected from a metal layer in the OLED display device to a human eye, thereby improving image quality of the OLED display device.

Accordingly, the present invention provides an anti-reflection bottom-emitting type OLED display device, comprising:

a substrate provided with a plurality of black matrixes spaced apart from each other;

a plurality of drive transistors, the drive transistors being arranged in an array on the substrate and disposed corresponding to the black matrixes respectively;

a light emitting layer disposed on the drive transistors; and a buffer layer disposed on the substrate, each black matrix being disposed between the buffer layer and the substrate or between the buffer layer and the light emitting layer;

wherein an opening region is defined between each two adjacent black matrixes, the light emitting layer comprises a plurality of light-emitting material layers arranged in an array, each light-emitting material layer defines a display region and a non-display region, each opening region is disposed corresponding to each display region, and each non-display region is disposed corresponding to each black matrix.

According to one embodiment of the present invention, the black matrixes are disposed in the substrate and divide the substrate into a first bottom lining and a second bottom lining, and the first bottom lining is disposed further away from each drive transistor than the second bottom lining.

According to one embodiment of the present invention, the anti-reflection bottom-emitting type OLED display device further comprises an inorganic insulating layer, the inorganic insulating layer being disposed between the first bottom lining and the black matrixes or between the second bottom lining and the black matrixes.

According to one embodiment of the present invention, the inorganic insulating layer is made of SiNx, SiOx, or SiCx, the first bottom lining or the second bottom lining is made of a material selected from one of polyimide (PI), polycarbonate (PC), polyethersulfone (PES), polyethylene terephthalate (PET), polyethylene naphthalate (PEN), polyarylate (PAR), and glass fiber reinforced plastic (FRP), or a combination thereof, and the first bottom lining and the second bottom lining are made of the same material or different materials.

According to one embodiment of the present invention, the anti-reflection bottom-emitting type OLED display device comprises, sequentially disposed on the substrate, the buffer layer, an active layer, a gate electrode insulating layer, a gate electrode layer, an interlayer insulating layer, a source/drain electrode layer, a planarization layer, and a packaging layer disposed on the light emitting layer; the light emitting layer comprising a plurality of anode electrodes, the light-emitting material layers, a plurality of cathode electrodes, and a plurality of pixel defining layers (PDLs), wherein the pixel defining layers define and limit a size of each light-emitting material layer.

The present invention provides an anti-reflection bottom-emitting type OLED display device, comprising a substrate, a plurality of drive transistors, and a light emitting layer. The substrate is provided with a plurality of black matrixes spaced apart from each other. The drive transistors are arranged in an array on the substrate and disposed corresponding to the black matrixes respectively. The light emitting layer is disposed on the drive transistors. An opening region is defined between each two adjacent black matrixes, the light emitting layer comprises a plurality of light-emitting material layers arranged in an array, each light-emitting material layer defines a display region and a non-display region, each opening region is disposed corresponding to each display region, and each non-display region is disposed corresponding to each black matrix.

According to one embodiment of the present invention, the anti-reflection bottom-emitting type OLED display device further comprises a buffer layer disposed on the substrate, and the black matrixes are disposed between the buffer layer and the substrate or between the buffer layer and the light emitting layer.

According to one embodiment of the present invention, the black matrixes are disposed in the substrate and divide the substrate into a first bottom lining and a second bottom lining, and the first bottom lining is disposed further away from each drive transistor than the second bottom lining.

According to one embodiment of the present invention, the anti-reflection bottom-emitting type OLED display device further comprises an inorganic insulating layer. The inorganic insulating layer is disposed between the first bottom lining and the black matrixes or between the second bottom lining and the black matrixes.

According to one embodiment of the present invention, the inorganic insulating layer is made of SiNx, SiOx, or SiCx. The first bottom lining or the second bottom lining is made of a material selected from one of polyimide (PI), polycarbonate (PC), polyethersulfone (PES), polyethylene terephthalate (PET), polyethylene naphthalate (PEN), polyarylate (PAR), and glass fiber reinforced plastic (FRP), or a combination thereof. The first bottom lining and the second bottom lining are made of the same material or different materials.

According to one embodiment of the present invention, the anti-reflection bottom-emitting type OLED display device comprises, sequentially disposed on the substrate, the buffer layer, an active layer, a gate electrode insulating layer, a gate electrode layer, an interlayer insulating layer, a source/drain electrode layer, a planarization layer, and a packaging layer disposed on the light emitting layer. The light emitting layer comprises a plurality of anode electrodes, the light-emitting material layer, a plurality of cathode electrodes, and a plurality of pixel defining layers (PDLs), wherein the pixel defining layers define and limit a size of each light-emitting material layer.

The present invention further provides a manufacturing method of an anti-reflection bottom-emitting type OLED display device, comprising steps as follows:

S10: providing a substrate;

S20: forming a plurality of black matrixes spaced apart from each other on the substrate;

S30: manufacturing on the black matrixes a plurality of drive transistors, the drive transistors being arranged in an array on the substrate and disposed corresponding to the black matrixes respectively; and S40: forming a light emitting layer on the drive transistors, the light emitting layer comprising a plurality of light-emitting material layers arranged in an array, each light-emitting material layer defines a display region and a non-display region, wherein an opening region is defined between each two adjacent black matrixes, each opening region is disposed corresponding to each display region, and each non-display region is disposed corresponding to each black matrix.

According to one embodiment of the present invention, providing the substrate further comprises forming a first bottom lining by coating or transfer-printing, the black matrixes are formed on the first bottom lining, and a second bottom lining is formed on the black matrixes.

According to one embodiment of the present invention, when the black matrixes are formed, a plurality of alignment marks are formed spaced apart from each other at a same time; and the plurality of alignment marks are used as a plurality of positioning marks for subsequently manufacturing the drive transistors.

According to one embodiment of the present invention, before or after the black matrixes are formed on the first bottom lining, the manufacturing method further comprises forming an inorganic insulating layer. The inorganic insulating layer is made of SiNx, SiOx, or SiCx. The first bottom lining or the second bottom lining is made of a material selected from one of polyimide (PI), polycarbonate (PC), polyethersulfone (PES), polyethylene terephthalate (PET), polyethylene naphthalate (PEN), polyarylate (PAR), and glass fiber reinforced plastic (FRP), or a combination thereof. The first bottom lining and the second bottom lining are made of the same material or different materials.

The present invention has the following advantages. By disposing the black matrixes on an upper surface of the substrate or in the substrate, the ambient light reflected by a metal layer or the like in the display device is shielded, so as to reduce or prevent the ambient light from being reflected to a human eye, thereby improving image quality of the display device. In addition, the process for making the black matrixes on the substrate is easy and simple, and can be completed by existing manufacturing devices. Furthermore, the inorganic insulating layer is disposed in the substrate, and the inorganic insulating layer and the buffer layer on the substrate together serve as a moisture barrier material and provide a double protection function to avoid damage to the drive transistors in the display device and prolong a lifespan.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DESCRIPTION OF SPECIFIC EMBODIMENTS OF THE INVENTION

The word "embodiment" mentioned in the detailed description means that a particular feature, structure, or characteristic described in connection with the embodiment may be included in at least one embodiment of the invention. The same terms appearing in different places in the specification are not necessarily limited to the same embodiment, but can belong to independent or alternative embodiments. In view of the technical solutions disclosed in the embodiments of the present invention, those skilled in the art should understand that the embodiments described herein may have other combinations or variations based on inventive concepts of the technical solutions.

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

Figure 1:
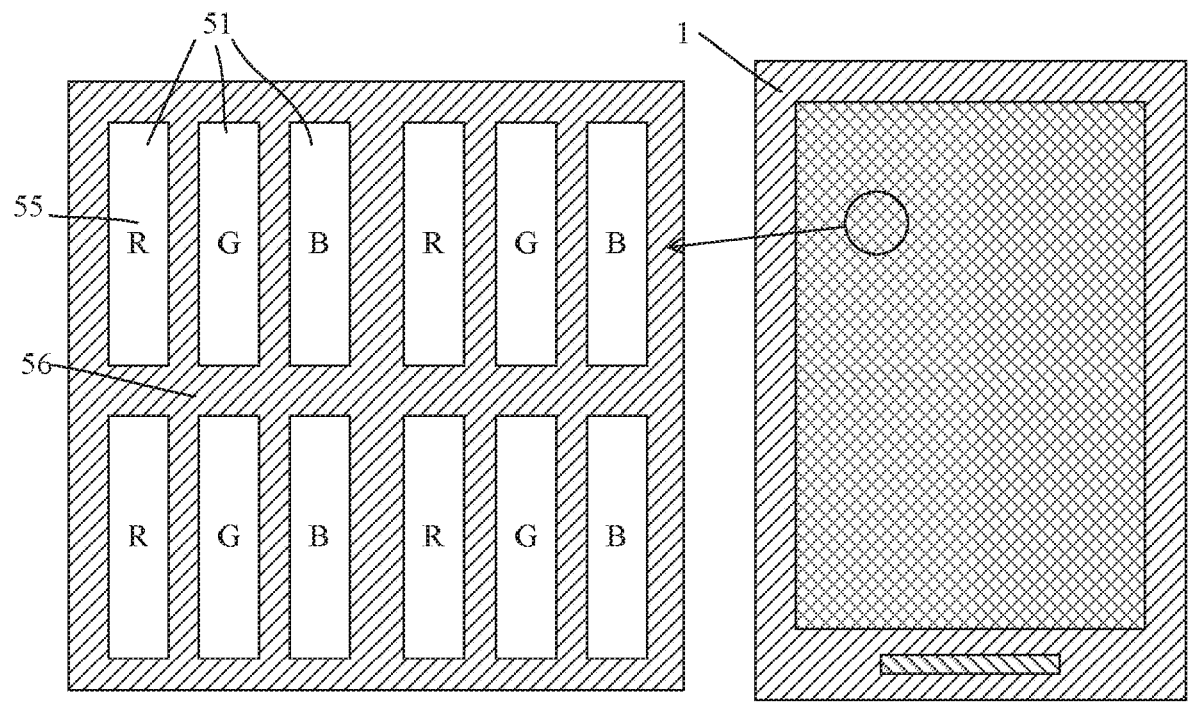
FIG. 1 is a schematic view illustrating light-emitting material layers arranged in an array according to a first embodiment of the present invention.
Figure 2:
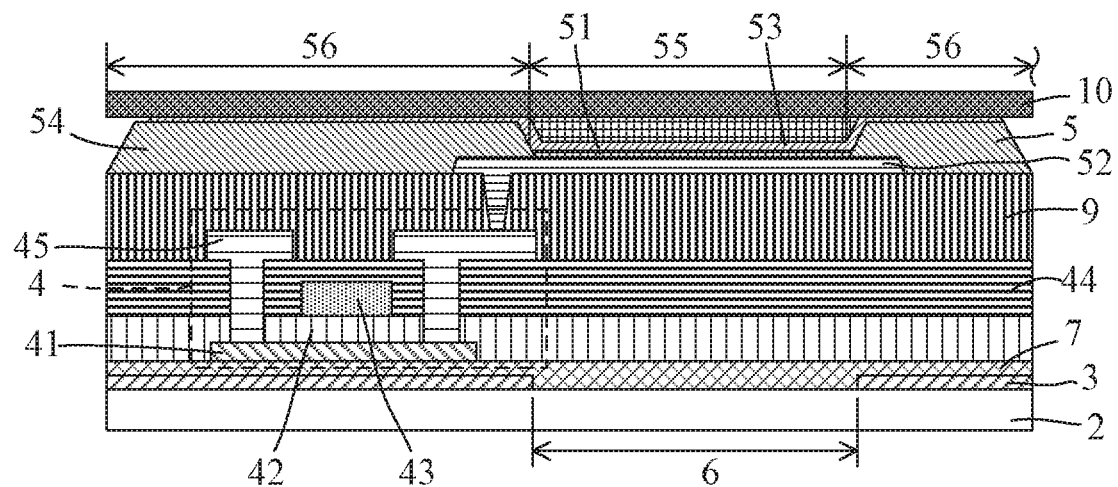
FIG. 2 is a cross-sectional view according to the first embodiment of the present invention.

Please refer to FIGS. 1 and 2 which are a schematic view and a cross-sectional view illustrating light-emitting material layers arranged in an array in an anti-reflection bottom-emitting type OLED display device according to the present invention. An anti-reflection bottom-emitting type OLED display device 1 is provided according to a first embodiment of the present invention. The anti-reflection bottom-emitting type OLED display device 1 comprises a substrate 2, a plurality of drive transistors 4, and a light emitting layer 5.

The substrate 2 is provided with a plurality of black matrixes 3 spaced apart from each other. The drive transistors 4 are arranged in an array on the substrate 2 and disposed corresponding to the black matrixes 3 respectively. The light emitting layer 5 is disposed on the drive transistors 4. An opening region 6 is defined between each two adjacent black matrixes 3. The light emitting layer 5 comprises a plurality of light-emitting material layers 51 arranged in an array. Each light-emitting material layer 51 defines a display region 55 and a non-display region 56. Each opening region 6 is disposed corresponding to each display region 55. In detail, each display region 55 for a sub-pixel coincides with each opening region 6 between the black matrixes 3 on the substrate. Each non-display region 56 is disposed corresponding to each black matrix 3.

Referring to FIG. 2, a buffer layer 7 is disposed on the substrate 2, each black matrix 3 is disposed between the buffer layer 7 and the substrate 2. In alternative embodiments, each black matrix 3 is disposed between the buffer layer 7 and the light emitting layer 5; configuration may vary according to requirement. The black matrix 3 is made of, but is not limited to, a metal (e.g. chromium; Cr), a metal alloy, a black resin, or a combination thereof.

Figure 3:
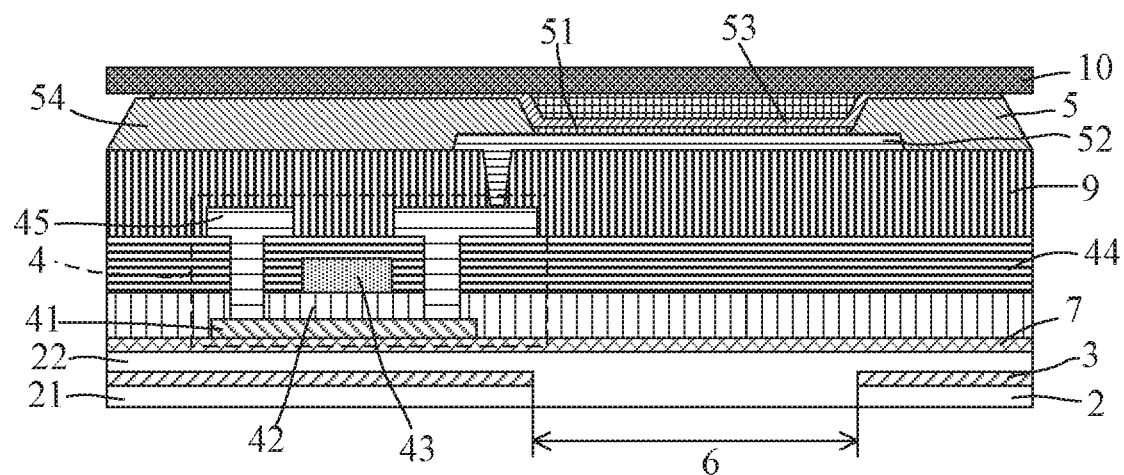
FIG. 3 is a cross-sectional view according to a second embodiment of the present invention.
Figure 4:
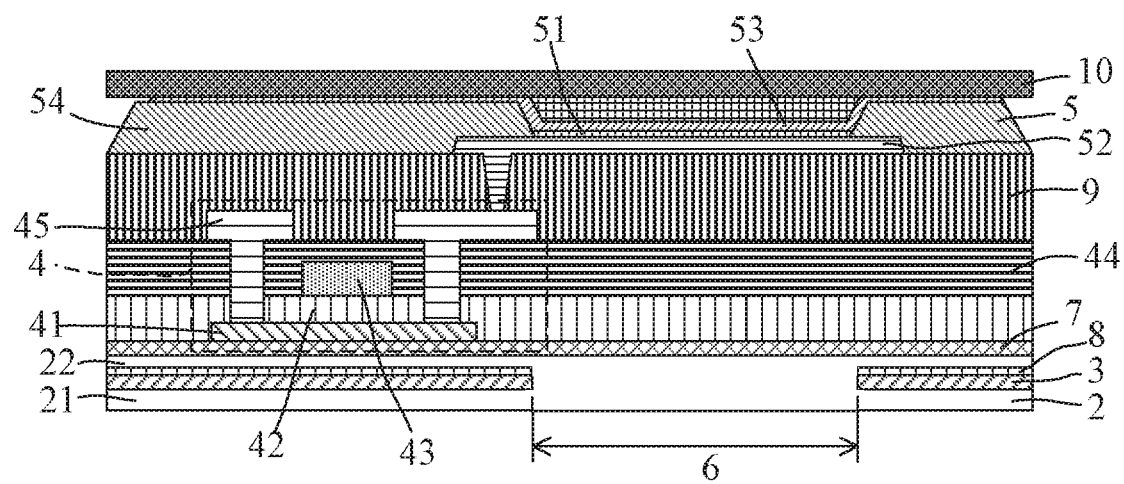
FIG. 4 is a cross-sectional view according to a third embodiment of the present invention.

Referring to FIGS. 3 and 4, the anti-reflection bottom-emitting type OLED display device 1 comprises, sequentially disposed on the substrate 2, the buffer layer 7, an active layer 41, a gate electrode insulating layer 42, a gate electrode layer 43, an interlayer insulating layer 44, a source/drain electrode layer 45, a planarization layer 9, and a packaging layer 10 disposed on the light emitting layer 5. The light emitting layer 5 comprises a plurality of anode electrodes 52, the light-emitting material layers 51, a plurality of cathode electrodes 53, and a plurality of pixel defining layers (PDLs) 54, wherein the pixel defining layers 54 define and limit a size of each light-emitting material layer 51. In other words, the pixel defining layers 54 define and limit a size of each sub-pixel, i.e. a light-emitting area of each sub-pixel. That is to say, the size and area of each light-emitting material layer 51 are the size and area of each sub-pixel.

Referring to FIGS. 2 to 4, each sub-pixel comprises the pixel defining layer 54, the anode electrode 52, the light-emitting material layer 51, and the cathode electrode 53. Through a voltage generated by the cathode electrode 53 and the anode electrode 52, the light-emitting material layer 51 is driven to emit light. Besides the light-emitting material layers 51 arranged in an array, the anti-reflection bottom-emitting type OLED display device 1 also comprises the non-display region (not illustrated) such as a bezel of the OLED display device 1. Below the pixel defining layer 54 and the bezel are disposed metal wiring, a circuit layer (a metal layer), and etc. which easily reflect strong ambient light. Therefore, the present invention utilizes the black matrixes 3 under the pixel defining layer 54 to shield the ambient light to thereby avoid or reduce the ambient light reflected from a metal electrode of the drive transistor 4 to a human eye, thus improving image quality of the OLED display device 1.

According to the second embodiment shown in FIG. 3, the black matrixes 3 are disposed in the substrate 2 and divide the substrate 2 into a first bottom lining 21 and a second bottom lining 22. The first bottom lining 21 is disposed further away from each drive transistor 4 than the second bottom lining 22. When the black matrixes 3 are made of an inorganic material, the black matrixes 3 replace a material such as SiNx/SiOx as a buffer material inside the substrate 2 to block water/moisture and prevent the drive transistors 4 from being damaged. According to the third embodiment shown in FIG. 4, the anti-reflection bottom-emitting type OLED display device 1 further includes an inorganic insulating layer 8. The inorganic insulating layer 8 is disposed between the first bottom lining 21 and the black matrixes 3 or between the second bottom lining 22 and the black matrixes 3. In the embodiment shown in FIG. 4, the inorganic insulating layer 8 is not disposed in the opening region 6 between the black matrixes 3. However, in alternative embodiments, the inorganic insulating layer 8 is under or on the black matrixes 3 and integrally formed therewith, or the inorganic insulating layer 8 can be disposed on the opening region 6.

The inorganic insulating layer 8 is made of, but is not limited to, SiNx, SiOx, or SiCx. The first bottom lining 21 or the second bottom lining 22 is made of a material selected from one of polyimide (PI), polycarbonate (PC), polyethersulfone (PES), polyethylene terephthalate (PET), polyethylene naphthalate (PEN), polyarylate (PAR), and glass fiber reinforced plastic (FRP), or a combination thereof. The first bottom lining 21 and the second bottom lining 22 are made of the same material or different materials, varied according to requirement.

Figure 5:
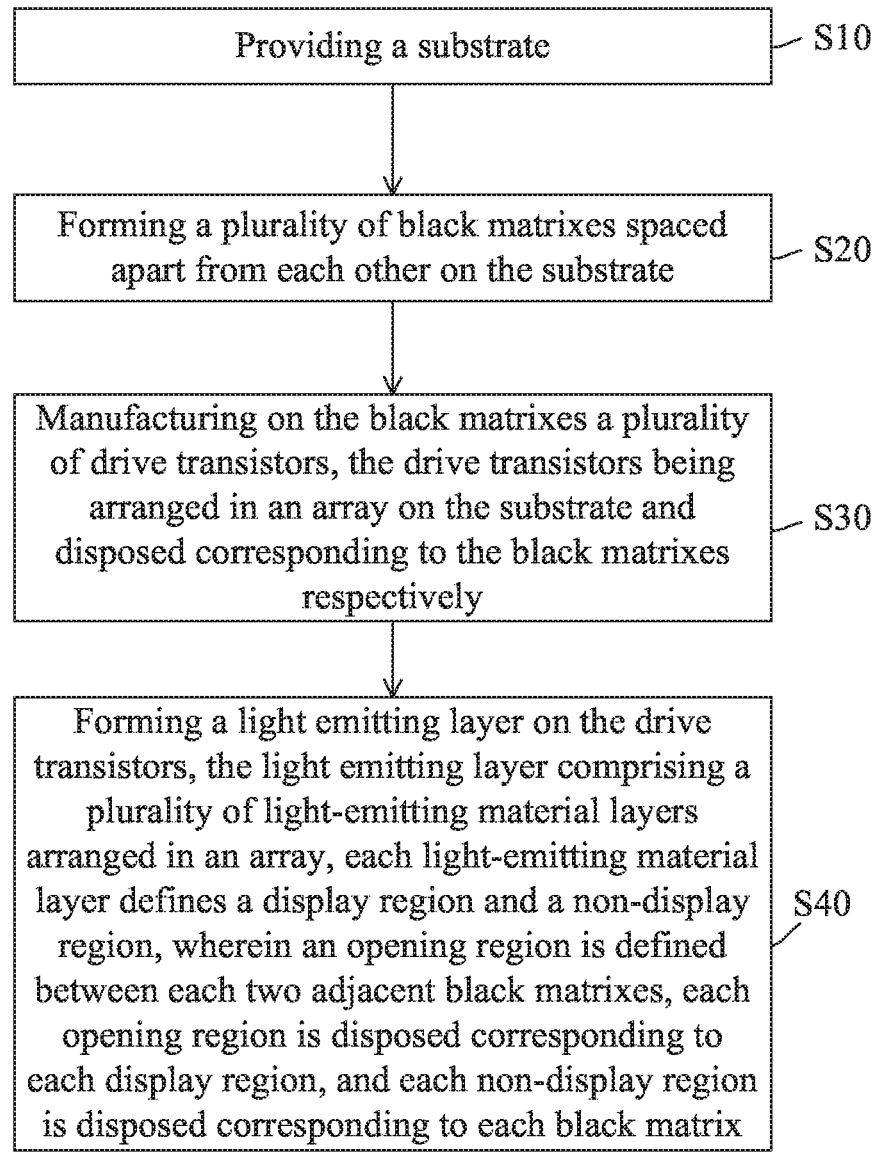
FIG. 5 is a process flow diagram illustrating a manufacturing method of an anti-reflection bottom-emitting type OLED display device.
Figure 6A:
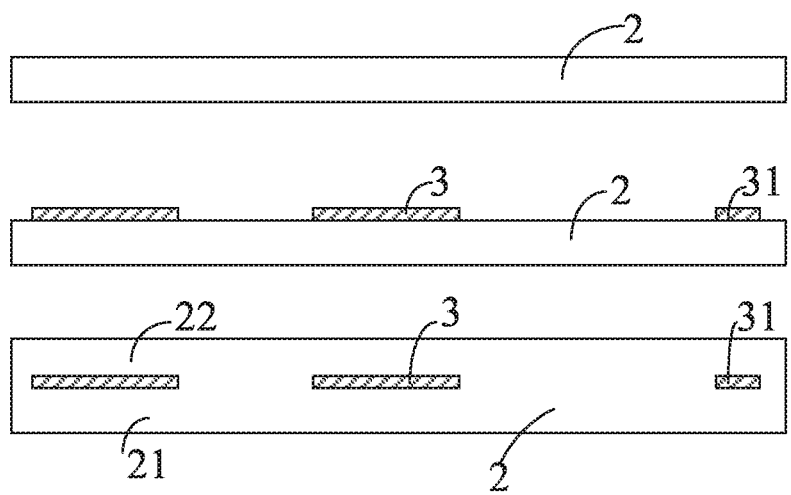
FIG. 6A is a schematic view illustrating a step of forming a plurality of black matrixes on the substrate.
Figure 6B:
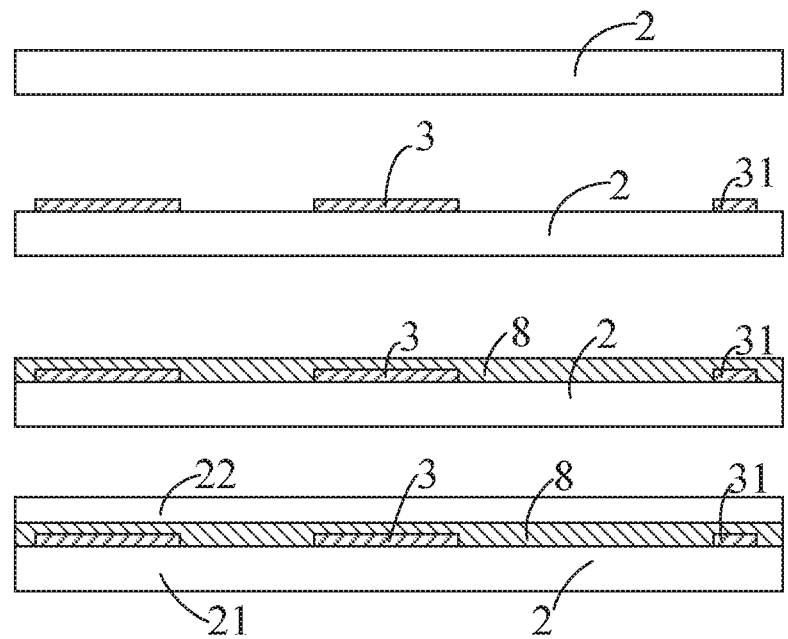
FIG. 6B is a schematic view illustrating a step of forming an inorganic insulating layer on the black matrixes.

Please refer to FIGS. 5 to 6B for a process flow diagram illustrating a manufacturing method of an anti-reflection bottom-emitting type OLED display device. The present invention further provides a manufacturing method of an anti-reflection bottom-emitting type OLED display device. The manufacturing method comprises steps as follows:

S10: providing a substrate 2;

S20: forming a plurality of black matrixes 3 spaced apart from each other on the substrate 2;

S30: manufacturing, on the black matrixes 3, a plurality of drive transistors and metal wires such as data lines and scan lines, the drive transistors 3 being arranged in an array on the substrate 2 and disposed corresponding to the black matrixes 3 respectively; and S40: forming a light emitting layer on the drive transistors, the light emitting layer comprising a plurality of light-emitting material layers arranged in an array, each light-emitting material layer defines a display region and a non-display region.

An opening region is defined between each two adjacent black matrixes 3. Each opening region is disposed corresponding to each display region. In detail, each display region 55 for a sub-pixel and each opening region 6 between the black matrixes 3 coincide on the substrate. Each non-display region is disposed corresponding to each black matrix 3.

In the embodiments shown in FIG. 6A, providing the substrate 2 further comprises forming a first bottom lining 21 by coating or transfer-printing. The black matrixes 3 are formed on the first bottom lining 21, and a second bottom lining 22 is formed on the black matrixes 3. When the black matrixes 3 are formed, a plurality of alignment marks 31 are formed spaced apart from each other at a same time. The plurality of alignment marks 31 are used as a plurality of positioning marks for subsequently manufacturing the drive transistors. To be specific, the alignment marks 31 can ensure that each opening region between the black matrixes 3 is disposed corresponding to the display region of each light-emitting material layer. Each black matrix 3 is disposed corresponding to the non-display region of each light-emitting material layer and the bezel of the OLED display device, thereby shielding ambient light.

In the embodiments shown in FIG. 6B, before or after the black matrixes 3 are formed on the first bottom lining 21, the manufacturing method further comprises forming an inorganic insulating layer 8. It should be noted that the insulating layer at one side of the black matrixes 3 in FIG. 4 is disposed differently from that in FIG. 6B. That is, in FIG. 4, the inorganic insulating layer 8 is not disposed on the opening region 6 between the black matrixes 3; however, in alternative embodiments, the inorganic insulating layer 8 may also be disposed below or above the black matrixes 3 and integrally formed therewith, or may be disposed on the opening region 6. The inorganic insulating layer 8 is made of, but is not limited to, SiNx, SiOx, or SiCx, and serves as a buffer structure to block water/moisture and prevent the drive transistors from being damaged. The first bottom lining 21 or the second bottom lining 22 is made of a material selected from one of polyimide (PI), polycarbonate (PC), polyethersulfone (PES), polyethylene terephthalate (PET), polyethylene naphthalate (PEN), polyarylate (PAR), and glass fiber reinforced plastic (FRP), or a combination thereof. The first bottom lining 21 and the second bottom lining 22 are made of the same material or different materials.

Therefore, by providing the black matrixes on an upper surface of the substrate or in the substrate, the present invention blocks the ambient light reflected by a metal layer or the like in the display device to reduce or prevent the ambient light from being reflected to a human eye, thus improving the image quality of the OLED display device. In addition, the process of the present invention for making the black matrixes on the substrate is easy and simple, and can be completed by existing manufacturing devices. Furthermore, the inorganic insulating layer is disposed in the substrate, and the inorganic insulating layer and the buffer layer on the substrate can together serve as a moisture barrier material, and achieve a double protection function to avoid damage to the drive transistors in the OLED display device and prolong a lifespan. The manufacturing steps of some embodiments are described above, but the present invention is not limited thereto. In the above embodiments, a bottom-emitting type OLED display device is preferred; however, in alternative embodiments, the present invention can use a transparent OLED display device or other suitable OLED display device instead of the bottom-emitting type OLED display device.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. An anti-reflection bottom-emitting type OLED display device, comprising:
    a substrate provided with a plurality of black matrixes spaced apart from each other, wherein the black matrixes are disposed in the substrate and divide the substrate into a first bottom lining and a second bottom lining;
    a plurality of drive transistors, wherein the drive transistors are arranged in an array on the substrate and disposed corresponding to the black matrixes respectively, and the first bottom lining is disposed further away from each drive transistor than the second bottom lining;
    a light emitting layer disposed on the drive transistors;
    a buffer layer disposed on the substrate, each black matrix being disposed between the buffer layer and the substrate or between the buffer layer and the light emitting layer; and
    an inorganic insulating layer disposed between the first bottom lining and the black matrixes or between the second bottom lining and the black matrixes;
    wherein an opening region is defined between each two adjacent black matrixes, the light emitting layer comprises a plurality of light-emitting material layers arranged in an array, each light-emitting material layer defines a display region and a non-display region, each opening region is disposed corresponding to each display region, and each non-display region is disposed corresponding to each black matrix; and
    wherein an orthogonal projection of the opening region projected on the substrate is not overlapped with an orthogonal projection of the driver transistor projected on the substrate.

2. The anti-reflection bottom-emitting type OLED display device according to claim 1, wherein the inorganic insulating layer is made of SiNx, SiOx, or SiCx; the first bottom lining or the second bottom lining is made of a material selected from one of polyimide (PI), polycarbonate (PC), polyethersulfone (PES), polyethylene terephthalate (PET), polyethylene naphthalate (PEN), polyarylate (PAR), and glass fiber reinforced plastic (FRP), or a combination thereof; and the first bottom lining and the second bottom lining are made of the same material or different materials.

3. The anti-reflection bottom-emitting type OLED display device according to claim 1, comprising, sequentially disposed on the substrate, the buffer layer, an active layer, a gate electrode insulating layer, a gate electrode layer, an interlayer insulating layer, a source/drain electrode layer, a planarization layer, and a packaging layer disposed on the light emitting layer; the light emitting layer comprising a plurality of anode electrodes, the light-emitting material layers, a plurality of cathode electrodes, and a plurality of pixel defining layers (PDLs), wherein the pixel defining layers define and limit a size of each light-emitting material layer.

4. An anti-reflection bottom-emitting type OLED display device, comprising:

a substrate provided with a plurality of black matrixes spaced apart from each other, wherein the black matrixes are disposed in the substrate and divide the substrate into a first bottom lining and a second bottom lining;

a plurality of drive transistors, wherein the drive transistors are arranged in an array on the substrate and disposed corresponding to the black matrixes respectively, and the first bottom lining is disposed further away from each drive transistor than the second bottom lining;

a light emitting layer disposed on the drive transistors; and an inorganic insulating layer disposed between the first bottom lining and the black matrixes or between the second bottom lining and the black matrixes;

wherein an opening region is defined between each two adjacent black matrixes, the light emitting layer comprises a plurality of light-emitting material layers arranged in an array, each light-emitting material layer defines a display region and a non-display region, each opening region is disposed corresponding to each display region, and each non-display region is disposed corresponding to each black matrix; and wherein an orthogonal projection of the opening region projected on the substrate is not overlapped with an orthogonal projection of the driver transistor projected on the substrate.

5. The anti-reflection bottom-emitting type OLED display device according to claim 4, further comprising a buffer layer disposed on the substrate, the black matrixes being disposed between the buffer layer and the substrate or between the buffer layer and the light emitting layer.

6. The anti-reflection bottom-emitting type OLED display device according to claim 4, wherein the inorganic insulating layer is made of SiNx, SiOx or SiCx; the first bottom lining or the second bottom lining is made of a material selected from one of polyimide (PI), polycarbonate (PC), polyethersulfone (PES), polyethylene terephthalate (PET), polyethylene naphthalate (PEN), polyarylate (PAR), and glass fiber reinforced plastic (FRP), or a combination thereof; and the first bottom lining and the second bottom lining are made of the same material or different materials.

7. The anti-reflection bottom-emitting type OLED display device according to claim 4, comprising, sequentially disposed on the substrate, the buffer layer, an active layer, a gate electrode insulating layer, a gate electrode layer, an interlayer insulating layer, a source/drain electrode layer, a planarization layer, and a packaging layer disposed on the light emitting layer; the light emitting layer comprising a plurality of anode electrodes, the light-emitting material layers, a plurality of cathode electrodes, and a plurality of pixel defining layers (PDLs), wherein the pixel defining layers define and limit a size of each light-emitting material layer.

\* \* \* \* \*